(12) United States Patent
Leung et al.

(10) Patent No.: US 9,212,801 B2
(45) Date of Patent: Dec. 15, 2015

(54) ELECTRICAL CONNECTIONS FOR A LIGHT-EMITTING DIODE LAMP

(71) Applicant: Huizhou Light Engine Limited, Huizhou, Guangdong (CN)

(72) Inventors: Tean Sue-Anne Leung, Hong Kong (CN); Eddie Ping Kuen Li, Hong Kong (CN)

(73) Assignee: Huizhou Light Engine Ltd., Guangdong (CN)

( * ) Notice: Subject to any disclaimer, the term of this patent is extended or adjusted under 35 U.S.C. 154(b) by 187 days.

(21) Appl. No.: 13/683,838

(22) Filed: Nov. 21, 2012

(65) Prior Publication Data

US 2013/0128573 A1    May 23, 2013

Related U.S. Application Data

(60) Provisional application No. 61/563,468, filed on Nov. 23, 2011.

(51) Int. Cl.
*H01R 33/00* (2006.01)
*B60Q 1/06* (2006.01)
(Continued)

(52) U.S. Cl.
CPC .............. *F21V 3/005* (2013.01); *F21K 9/1355* (2013.01); *F21V 23/06* (2013.01); *F21V 29/506* (2015.01); *F21V 23/006* (2013.01); *F21V 29/87* (2015.01);
(Continued)

(58) Field of Classification Search
CPC ... F21K 9/1355; F21V 23/006; F21V 29/246; F21V 19/004; F21V 23/009; F21V 23/06

USPC .............. 362/294, 307, 311.01, 311.02, 363, 362/646, 373, 650, 651, 249.02
See application file for complete search history.

(56) References Cited

U.S. PATENT DOCUMENTS 5,747,919 A * 5/1998 Gandhi et al. ........... 313/318.01
6,736,526 B2 * 5/2004 Matsuba et al. ............... 362/260
(Continued)

FOREIGN PATENT DOCUMENTS

CN        201206743 Y    3/2009
CN        201212656 Y    3/2009
(Continued)

OTHER PUBLICATIONS

Sep. 28, 2014 Office Action for Chinese Patent Application No. 201280057553.X (with English translation).

*Primary Examiner* — Evan Dzierzynski
*Assistant Examiner* — Erin Kryukova
(74) *Attorney, Agent, or Firm* — Schiff Hardin LLP

(57) ABSTRACT

An LED lamp comprises: a lamp base having live and neutral contacts for supplying electrical power to the LED lamp; a substantially hollow lamp holder; a PCB assembly comprising: first and second connection pins; a table portion attached to the top of each of the first and second connection pins; and at least one connecting structure formed at a top surface of the table portion and electrically coupled to the first and second connection pins; an LED PCB comprising at least one LED affixed to a PCB and an LED PCB connector having connector pins electrically coupled to the at least one LED and to the at least one connecting structure of the table portion; and a heat sink being configured to thermally couple to the at least one LED, and a globe having a bottom portion which is thermally coupled to an outer surface of the heat sink.

15 Claims, 5 Drawing Sheets

(51) Int. Cl.
*F21V 29/00* (2015.01)
*F21S 13/10* (2006.01)
*F21V 3/00* (2015.01)
*F21V 15/00* (2015.01)
*F21V 5/00* (2015.01)
*F21K 99/00* (2010.01)
*F21V 23/06* (2006.01)
*F21V 29/506* (2015.01)
*F21V 23/00* (2015.01)
*F21Y 101/02* (2006.01)
*F21V 29/87* (2015.01)
*F21V 29/89* (2015.01)

(52) U.S. Cl.
CPC .............. *F21V 29/89* (2015.01); *F21Y 2101/02* (2013.01); *Y10T 29/4913* (2015.01); *Y10T 29/53174* (2015.01)

(56) References Cited

U.S. PATENT DOCUMENTS

| | | | |
|---|---|---|---|
| 7,965,023 B1 * | 6/2011 | Liang | 313/45 |
| 8,142,227 B1 * | 3/2012 | Kuo | 439/611 |
| 8,154,179 B2 * | 4/2012 | Chen | 313/46 |
| 8,222,820 B2 * | 7/2012 | Wang et al. | 315/32 |
| 8,419,240 B2 * | 4/2013 | Lim | 362/373 |
| 8,523,411 B2 * | 9/2013 | Kawagoe et al. | 362/373 |
| 2011/0028015 A1 * | 2/2011 | Mostoller et al. | 439/280 |
| 2011/0169406 A1 | 7/2011 | Weekamp et al. | |
| 2012/0025705 A1 * | 2/2012 | Chang | 315/32 |
| 2012/0025706 A1 * | 2/2012 | Wang et al. | 315/35 |
| 2012/0049737 A1 * | 3/2012 | Kitagawa et al. | 315/53 |
| 2012/0069545 A1 * | 3/2012 | Choi et al. | 362/84 |
| 2012/0147608 A1 * | 6/2012 | Kawagoe et al. | 362/294 |
| 2013/0039071 A1 * | 2/2013 | Wang | 362/294 |
| 2013/0063945 A1 * | 3/2013 | Wu et al. | 362/249.02 |
| 2013/0077286 A1 * | 3/2013 | Hu | 362/85 |

FOREIGN PATENT DOCUMENTS

| | | | | |
|---|---|---|---|---|
| CN | 101430079 A | | 5/2009 | |
| CN | 102042495 A | | 5/2011 | |
| CN | 201897106 U | | 7/2011 | |
| CN | 201935008 U | | 8/2011 | |
| CN | 202024160 U | | 11/2011 | |
| CN | 202032335 U | | 11/2011 | |
| KR | 2011104782 A | * | 9/2011 | .............. F21V 17/00 |
| KR | 20110104782 | | 9/2011 | |
| KR | 20120001209 A | | 1/2012 | |
| KR | 20120001210 A | | 1/2012 | |
| KR | 101175360 B1 | | 8/2012 | |

* cited by examiner

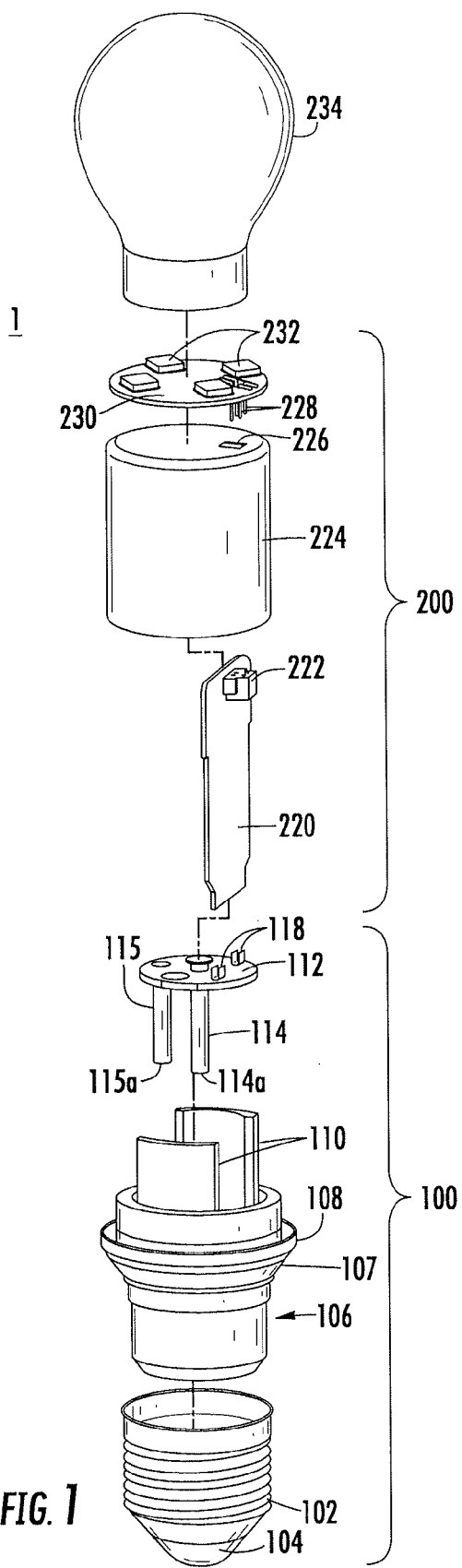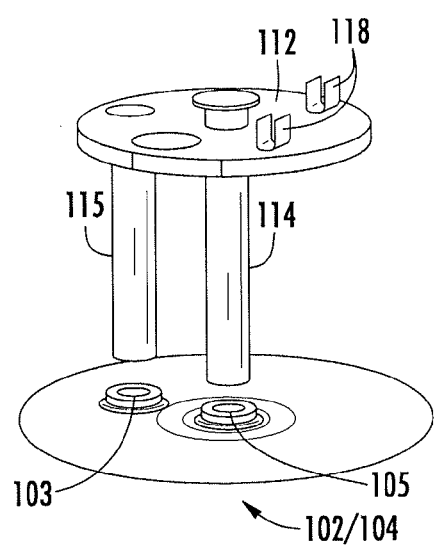
FIG. 1
FIG. 2

ELECTRICAL CONNECTIONS FOR A LIGHT-EMITTING DIODE LAMP

CROSS-REFERENCE TO RELATED APPLICATIONS

This utility application claims the benefit under 35 U.S.C. §119(e) of U.S. Provisional Patent Application No. 61/563,468, filed Nov. 23, 2011, the entirety of which is incorporated herein by reference.

BACKGROUND OF THE INVENTION

The present invention generally relates to improved lamp holders for light emitting diode ("LED") lighting and LED lamps incorporating such lamp holders, and improved heat dissipation methods and structures, and improved methods and structures for coupling LED lamps to sources of power.

In order to provide electric power to the LEDs in an LED lamp, an electrical connection must be provided from the source of electric power, such as a wall or ceiling power source, or battery, to the LEDs themselves, typically via a PC board (PCB) on which the LEDs are mounted. Conventionally, LED lamps include lamp holders that are soldered with wire connections from the base of the LED lamp to the PCB on which the LEDs are mounted. However, soldering requires relatively complicated processing, performed either by hand or by automation. Further, soldering in this manner requires testing to guard against defects, such as a "cold solder" connection.

Certain prior art devices utilize electroplated poles formed in the inside of the lamp cap, for example the threaded E27 cap, to contact connectors on the lamp base to supply power to the LEDs. However, with such a design, the metal E27 cap must be cast so as to form the electroplated poles, which complicates the manufacturing process for the cap.

It would be desirable to have a lamp base design that uses relatively simple and reliable connection methods, while at the same time being simple to manufacture and provide good heat dissipation. It would also be desirable to have improved heat dissipation structures within the LED lamp to permit a simple and aesthetically pleasing design with increased safety features.

BRIEF SUMMARY OF THE INVENTION

In accordance with a first aspect of the present invention, an LED lamp, comprising: a lamp base having a live contact and a neutral contact for supplying electrical power to the LED lamp; a substantially hollow lamp holder, the lamp holder having a lower portion seated within an upper portion of the lamp base; a PCB assembly comprising: first and second connection pins, each having a lower end portion, the lower end portion of the first connection pin contacting the live contact of the lamp base and the lower end portion of the second connection pin contacting the neutral contact of the lamp base; a table portion attached to the top of each of the first and second connection pins, and perpendicular to a lengthwise direction of the first and second connection pins; and at least one connecting structure formed at a top surface of the table portion and electrically coupled to the first and second connection pins; an LED PCB comprising at least one LED affixed to a PCB and an LED PCB connector having connector pins electrically coupled to the at least one LED and to the at least one connecting structure of the table portion; and a heat sink comprising: a top surface, to which the LED PCB is thermally coupled, the top surface having an aperture through which extend the connector pins of the LED PCB connector, the heat sink being configured to thermally couple to the at least one LED, and a globe having a bottom portion which is thermally coupled to an outer surface of the heat sink so as to permit heat to pass from the heat sink to the outside environment through the bottom portion of the globe.

In another aspect, the LED lamp further comprises a vertical PCB configured to electrically couple the at least one connecting structure of the table portion to the connector pins of the LED PCB connector.

In another aspect, the lamp holder further comprises a slotted area formed at a top portion of the lamp holder, wherein side edges of the vertical PCB are seated in the slotted area of the lower portion, and a bottom edge of the vertical PCB is structured to contact the connecting structure of the table portion of the table portion.

In another aspect, the at least one connecting structure of the table portion comprises clips in which the bottom edge of the vertical PCB is seated.

In another aspect, the lamp holder further comprises an upper rim configured to mate with a lower edge of the globe when the LED lamp is assembled.

In another aspect, the at least one lower end of the first and second connection pins of the PCB assembly is spring loaded.

In another aspect, the heat sink is cylindrical in shape.

In another aspect, the heat sink is made of a material selected from a group consisting of aluminum, copper, alloys of aluminum and copper, steel, cast iron, plastic, and a combination thereof.

In another aspect, the lower portion is cylindrical.

In accordance with a second aspect of the present invention, a method of electrically coupling at least one LED of an LED lamp to a lamp base having a live contact and a neutral contact for supplying electrical power to the LED lamp, the method comprising: providing a PCB assembly, comprising: first and second connection pins, each having a lower end portion, the lower end portion of the first connection pin contacting the live contact of the lamp base and the lower end portion of the second connection pin contacting the neutral contact of the lamp base; a table portion attached to the top of each of the first and second connection pins, and perpendicular to a lengthwise direction of the first and second connection pins; and at least one connecting structure formed at a top surface of the table portion and electrically coupled to the first and second connection pins.

In another aspect, the method further comprises providing an LED PCB comprising at least one LED affixed to a PCB and an LED PCB connector having connector pins electrically coupled to the at least one LED and to the at least one connecting structure of the table portion.

In another aspect, the method further comprises providing a vertical PCB configured to electrically couple the at least one connecting structure of the table portion to the connector pins of the LED PCB connector.

In another aspect, the method further comprises providing a lamp holder seated in the lamp base, the lamp holder comprising a slotted area formed at a top portion of the lamp holder, wherein side edges of the vertical PCB are seated in the slotted area, and a bottom edge of the vertical PCB is structured to contact the at least one connecting structure of the table portion.

In another aspect, the at least one connecting structure of the table portion comprises clips into which the bottom edge of the vertical PCB is seated.

In another aspect, the at least one lower end of the first and second connection pins of the PCB assembly is spring loaded.

In accordance with a third aspect of the present invention, a device for electrically coupling at least one LED of an LED lamp to a lamp base having a live contact and a neutral contact for supplying electrical power to the LED lamp, the device comprising: a PCB assembly, comprising: first and second connection pins, each having a lower end portion, the lower end portion of the first connection pin contacting the live contact of the lamp base and the lower end portion of the second connection pin contacting the neutral contact of the lamp base; a table portion attached to the top of each of the first and second connection pins, and perpendicular to a lengthwise direction of the first and second connection pins; and at least one connecting structure formed at a top surface of the table portion and electrically coupled to the first and second connection pins.

In another aspect, the device further comprises an LED PCB comprising at least one LED affixed to a PCB and an LED PCB connector having connector pins electrically coupled to the at least one LED and to the at least one connecting structure of the table portion.

In another aspect, the device further comprises a vertical PCB configured to electrically couple the at least one connecting structure of the table portion to the connector pins of the LED PCB connector.

In another aspect, the device further comprises a lamp holder seated in the lamp base, the lamp holder comprising a slotted area formed at a top portion of the lamp holder, wherein side edges of the vertical PCB are seated in the slotted area, and a bottom edge of the vertical PCB is structured to contact the at least one connecting structure of the table portion.

In another aspect, the at least one connecting structure of the table portion comprises clips into which the bottom edge of the vertical PCB is seated.

In another aspect, the at least one lower end of the first and second connection pins of the PCB assembly is spring loaded.

In accordance with a fourth aspect of the present invention, a method of dissipating heat generated from an LED lamp having at least one LED mounted within the lamp, the method comprising: providing a heat sink having an outer surface, the heat sink being thermally coupled to the at least one LED; and providing a globe, the globe having a bottom portion which is thermally coupled to the outer surface of the heat sink so as to permit heat to pass from the heat sink to the outside environment through the bottom portion of the globe.

In accordance with a fifth aspect of the present invention, a device for dissipating heat generated from an LED lamp having at least one LED mounted within the lamp, the device comprising: a heat sink having an outer surface, the heat sink being thermally coupled to the at least one LED; and a globe, the globe having a bottom portion which is thermally coupled to the outer surface of the heat sink so as to permit heat to pass from the heat sink to the outside environment through the bottom portion of the globe.

BRIEF DESCRIPTION OF THE DRAWINGS

The figures are for illustration purposes only and are not necessarily drawn to scale. The invention itself, however, may best be understood by reference to the detailed description which follows when taken in conjunction with the accompanying drawings in which:

FIG. 1 is an exploded view of the components of an exemplary LED lamp in accordance with an embodiment of the present invention;

FIG. 2 is a diagram showing how the connection pins contact the live and neutral contacts of the base cap of the LED lamp shown in FIG. 1;

DETAILED DESCRIPTION OF THE INVENTION

Figure 3:
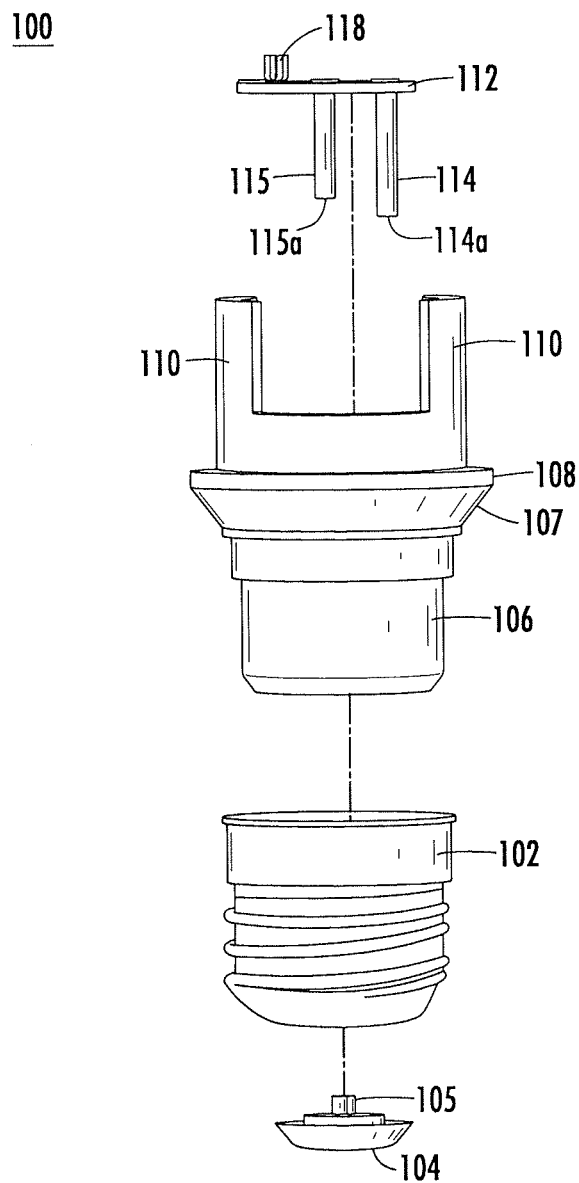
FIG. 3 is an exploded more detailed view of the lower element group of the LED lamp shown in FIG. 1.

In order to overcome the difficulties of the prior art, in the embodiments of the present invention an LED lamp holder is provided comprising a secure electrical connection between a source of electrical power and the LEDs, while providing ease of manufacturing of the components and the assembled unit. As discussed in more detail below, the present invention preferably utilizes a spring pin connection design that electrically couples the LEDs with the lamp base and the source of electrical power. According to additional aspects of the present invention, a heat sink is located so that it is within the globe, e.g., within the glass of the bulb, in the assembled LED lamp, allowing heat to be dissipated from the LED device, through the globe to the outside environment, providing a reduction in the amount of exposed metal as compared with conventional LED lamps.

FIG. 1 is an exploded view of an LED lamp 1. Lamp 1 includes a lower element group 100 and upper element group 200. The lower element group 100 includes a lamp cap 102, which can comprise, for example, an Edison (e.g., E27) threaded configuration, and a connection button 104, which couples with the bottom of the lamp cap 102 and contacts an electrical power source, e.g., in a light socket.

The lower element group 100 also comprises a lamp holder 106 that is preferably a generally hollow tubular plastic structure molded so as to fit into the top of the lamp cap 102. The lamp holder 106 preferably has a tapered portion 107 towards the top, leading to a rim 108. The lamp holder is molded to also comprise a slotted top portion 110. The top portion 110 is slotted to facilitate mounting of other structural elements of the LED lamp 1, as will be discussed in more detail below. In the illustrated embodiment, the slotted top portion 110 is formed of dual wings, substantially facing one another. However, the invention is not limited to this configuration, and the slotted top portion my instead be formed of a single structure disposed completely around the top of the lamp holder, or may be divided into more than two wings.

The lower element group 100 also comprises a PCB assembly 112 having connection pins 114 (inner pin) and 115 (outer pin), and an electrical connecting structure, formed in the illustrated embodiment by clips 118. The PCB assembly 112 also has an upper table portion onto which the an electrical connecting structure is formed. In the illustrated embodiment, the electrical connecting structure comprises clips 118. The PCB assembly 112 is structured such that the pins 114 and 115 are electrically coupled to the clips 118 and also are ultimately electrically coupled, via the clips 118, to the LEDs of the LED lamp 1, to provide power to the LEDs.

The connection pins 114 and 115 extend downwardly from the table portion. When the lower element group 100 is assembled, PCB assembly 112 is installed down into the hollow central portion of the lamp holder 106, forming a mechanism for supplying electrical power from the lamp cap 102 to the LEDs of the LED lamp 1. In the assembled state, the connection pins 114 and 115 electrically couple to the lamp cap 102. Preferably, at least the outer connection pin 115 has a spring loaded tip 115a. The spring loading permits a secure connection to be maintained between the tip of the outer connection pin 115 and outer (neutral) portion of the bottom of the lamp cap 102, when the lamp is assembled.

FIG. 2 diagramatically depicts the contact between the pins 114 and 115 with the bottom of the lamp cap 102. As can be seen in FIG. 2, the outer connection pin 115 makes a secure electrical contact with an outer (neutral) portion of the bottom of the lamp cap 102 when the PCB 112 is inserted down into the lamp holder 106. The lengths of the outer and inner connection pins are preferably set to that the spring loaded tip 115a of the outer connection pin 115 is under tension in contact with the neutral portion of the bottom of the lamp cap 102 at the point at which the tip of pin 114 contacts the inner (live) portion of the lamp cap 102. Alternatively, both tips can have spring loaded tips. The connection method can work without the use of spring loaded tips if the lengths of the connection pins are formed to match the distances between the table portion of the PCB 112 and the respective outer and inner portions of the bottom of the lamp cap 102.

The connection button 104 has a central connector 105 that is a female connector that mates with the tapered lower portion 114a of the inner connection pin 114, to provide the live power to the lamp 1. The outer connection pin 115, which is preferably spring loaded, upon being inserted in the lamp holder 106, makes secure electrical contact with a neutral connector 103 at the bottom of the lamp cap 102, causing the spring loaded tip 115a to be under tension.

The central (live) connector 105 is preferably a female connector formed as a part of the connection button 104. The neutral outer connector may be formed as a circular metal strip around the periphery of the connection button 104, or may be a part of the lamp cap 102.

When assembled, the lower element group 100 allows electrical power to be channeled from, e.g., an electrical source such as a light socket, through the connection pins 114 and 115, to the PCB assembly 112 having clips 118. The power can be further supplied, via the clips 118, to LED circuitry coupled to the clips 118, which circuitry will be described below.

As discussed above, while the electrical connecting structure of the PCB assembly 112 can take the form of clips 118, the invention is not limited to this configuration and the electrical connecting structure could be implemented simply by provided an electrical contact area on the PCB assembly 112, or by providing an electrical connector mechanism, such as, but not limited to sockets or snap fit connectors, rather than clips.

The upper portion of the lamp 1 will next be described making reference to upper element group 200. The upper element group 200 preferably includes the vertical PCB 220 having connector 222, a heat sink 224, with aperture 226, the LED PCB 230 with LEDs 232 and connector pins 228, and the globe 234.

In assembling the LED lamp 1, the lower edge of the vertical PCB 220 slides into the clips 118, forming an electrical connection between the source of electrical power in the lamp cap 102 and the connector 222 at the top of the vertical PCB 220. The vertical PCB 220 preferably serves at least two functions. First, it provides a structural support mechanism for maintaining the spacing between the top of the table portion of the PCB assembly 112 and the top of the heat sink 224. It also functions to provide electrical coupling from the PCB assembly 112 to the LEDs 232, which are preferably mounted on the LED PCB 230, located on top of the heat sink 224.

The vertical PCB 220 has a connector 222 that functions to mate with connector pins 228 of the LED PCB 230. The connector 222 and the connector pins together, when connected to one another, provide an electrical connection between the vertical PCB 220 and the LED PCB 230, permitting power from the power source of the LED lamp 1 to be supplied to the LEDs 232.

Figure 4:
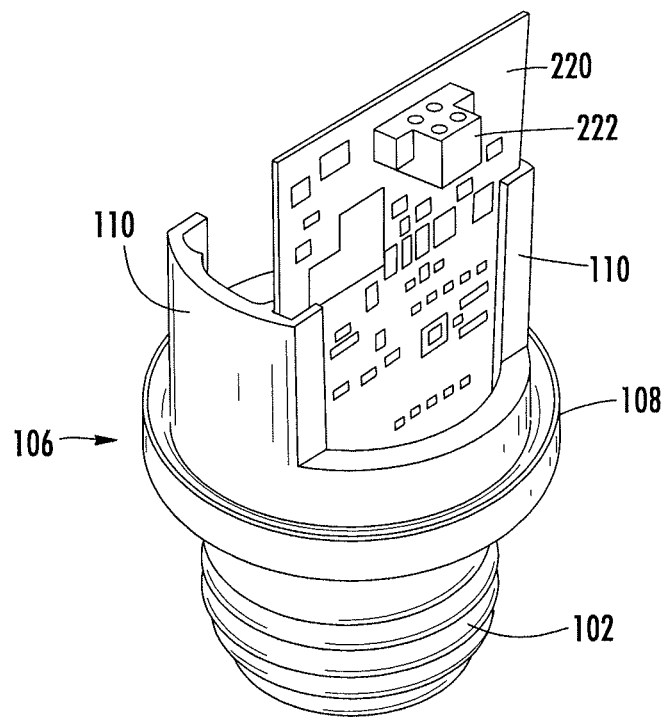
FIG. 4 is a perspective view of the vertical PCB installed into the slots in the lamp holder.
Figure 5:
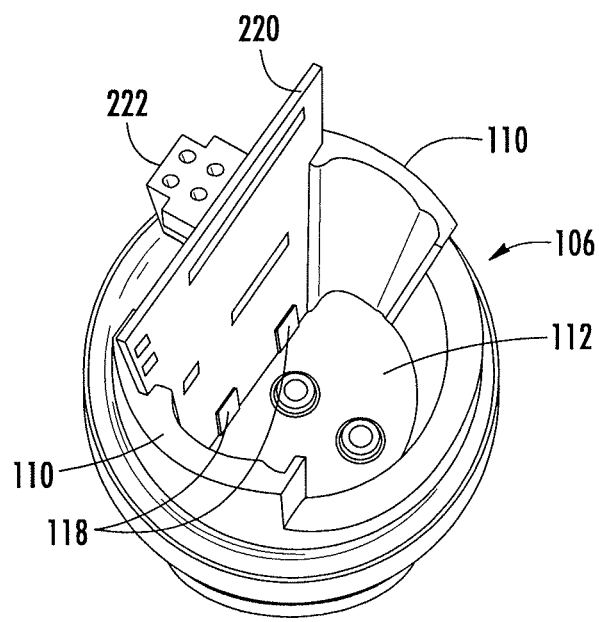
FIG. 5 is a view showing a partially assembled LED lamp in accordance with the present invention.

When the LED lamp 1 assembled, the PCB assembly 112 is fully inserted into the bottom of the lamp holder 106 so that the inner and outer pins contact the lamp cap's source of electrical power. This can be seen clearly in FIGS. 4 and 5, which show the lamp holder 106 having PCB assembly 112 inserted and the vertical PCB 220 inserted into the slots in the slotted top portion 110. As can be seen most clearly in FIG. 5, when the lamp is assembled, the PCB assembly 112 is seated all the way at the bottom of the lamp holder 106 and the bottom edge of the vertical PCB 220 is seated in the clips 118, while the sides of the vertical PCB 220 are held by the slots of the top portion 110.

Figure 6:
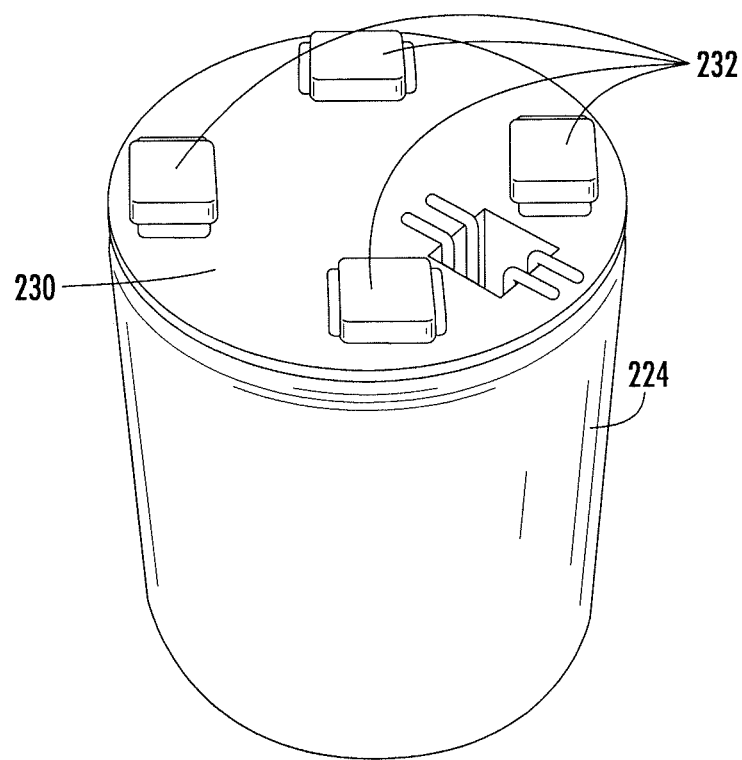
FIG. 6 shows the heat sink and the LED PCB having the LEDs mounted on top of the heat sink.

As can be seen in FIG. 6, the connector 222 mates with the connection pins 228, through the aperture 226 in the heat sink 224, to allow the electrical power to flow to the LED PCB 230 that houses the LEDs 232. When assembled, the LED PCB 230 with the LEDs 232 rests on top of the heat sink 224. The LED PCB 230 can completely or partially be thermally coupled to the heat sink 224.

During assembly of the LED lamp 1, the heat sink 224 is installed over the lamp holder 106, and the connection pins 228 are connected with the female connectors at the top of the connector 222. Preferably the heat sink 224 is proportioned such that it can fit snugly around the outer periphery of the top of the lamp holder 106.

The lower portion of the globe 234 fits downwardly over the heat sink 224 until the bottom edge of the globe 234 rests within the space formed by the rim 108 of the lamp holder 106. The globe 234 preferably performs, among other things, a light diffusing function, for example by being made of transparent or frosted glass or other light transmissive/diffusive material suitable for use as the globe in an LED lamp.

In accordance with an advantageous feature of the present invention, the lower portion of the globe 234 forms a snug fit around the periphery of the heat sink 224. This configuration allows heat from the LEDs to be dissipated through the heat sink 224 and then to be radiated out, through the portion of the globe that is contacting the heat sink 224, and to the outside environment.

The heat sink is preferably made of a suitable heat conductive material, such as, for example, copper, aluminum, alloys of copper or aluminum, steel or cast iron, plastics including but not limited to thermoplastics, or a combination thereof. Providing the heat sink 224 inside of the globe 234 is an aesthetic improvement over external metal heat sinks provided as part of the housing of conventional LED lamps. Having the heat sink inside of the globe, rather than on the outside, also makes the lamp appear and handle more like a traditional incandescent light bulb. Moreover, as the globe would be typically made of glass or plastic, which act as a good electrical insulators, it is much less likely, as compared with LED lamps having externally provided metal housings/heat sinks, that the user will receive a shock from handling the LED lamp.

While lamp cap 102 is shown in the figures as a threaded Edison, e.g., E26 or E27, the present invention is not limited to the disclosed embodiment and the lamp cap 102 can be shaped in the form of a connector having any known configuration, for example, a double bayonet style mounting, a smooth shaped connector, etc., for connection to any of a number of known wall or ceiling sockets known in the art.

In the illustrated embodiment, the heat sink 224 for conducting the heat generated by the LEDs 232 is cylindrical in shape, with a flat top portion on which the LED PCB 230 rests. However, the heat sink is not limited to a cylindrical shape, and can be, for example, a rectangular prism, a triangular prism, or other appropriate shape that can be made to have a close fit inside of a globe of the LED lamp.

Figure 7:
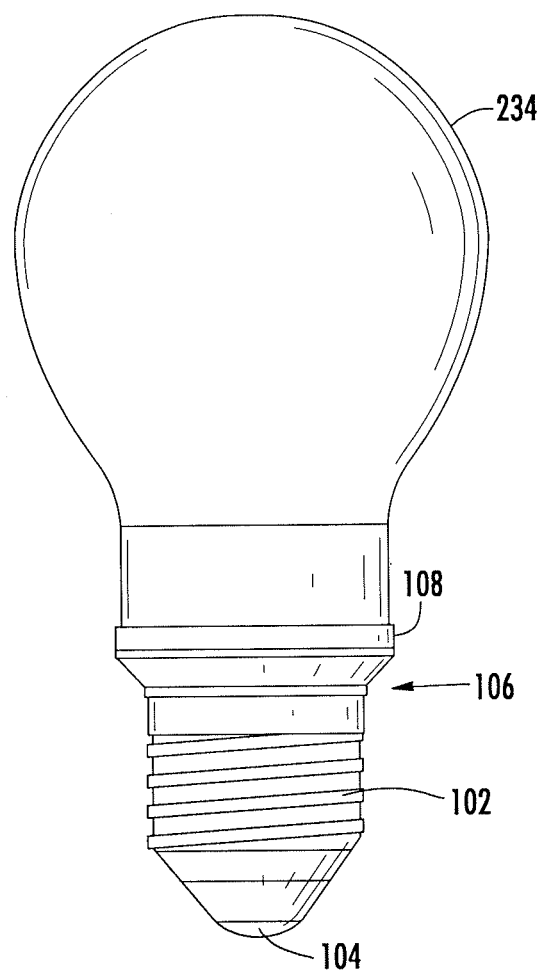
FIG. 7 is a view of the assembled LED lamp.

The assembled lamp 1 is structured such that heat can be dissipated from the LEDs 232 down to the top of the heat sink 224, and throughout the heat sink 224 to the outside environment, through the globe 234. An assembled lamp 1 is depicted in FIG. 7, although the internal components discussed above are not visible in FIG. 7.

While the LED lamp shown in FIGS. 1 and 2 is shown in the form of a light bulb, the present invention is not limited to LED lamps having this particular shape or configuration. The present invention may be used in any LED lamp configuration having a housing/heat sink that functions to conduct heat from the LEDs. For example, while the illustrated LED lamp is shown as having a rounded profile, the invention is not limited to this shape. The shape of the LED lamp can be of any appropriate shape for LED lamps, including but not limited to tubular, cylindrical or rectangular, and having housings/heat sinks of various shapes and configurations.

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, although a bulb shaped lamp has been illustrated, the present invention can be applied to the construction of other configurations of an LED lighting fixture. This provisional application is intended to cover any adaptations or variations of the specific embodiments discussed herein. Therefore, it is intended that this invention be limited only by the claims and the equivalents thereof.

What is claimed is:
1. An LED lamp, comprising:
(a) a lamp base having a live contact and a neutral contact for supplying electrical power to the LED lamp;
(b) a substantially hollow lamp holder, the lamp holder having a lower portion seated within an upper portion of the lamp base and first and second wing portions disposed along an interior surface of the lamp holder and extending outwardly from the lamp holder and away from the lamp base;
(c) a PCB assembly comprising:
    (i) first and second connection pins, each having a lower end portion, the lower end portion of the first connection pin contacting the live contact of the lamp base and the lower end portion of the second connection pin contacting the neutral contact of the lamp base, the first and second connections pins are in parallel to each other,
    (ii) a table portion attached to the top of each of the first and second connection pins, and perpendicular to a lengthwise direction of the first and second connection pins, wherein the first and second wing portions are configured to accept the table portion such that the table portion is disposed between the first and second wing portions; and
    (iii) at least one connecting structure formed at a top surface of the table portion and electrically coupled to the first and second connection pins;
(d) an LED PCB comprising at least one LED affixed to a PCB and an LED PCB connector having connector pins electrically coupled to the at least one LED and to the at least one connecting structure of the table portion, the connector pins are in parallel to each other;
(e) a heat sink comprising: a top surface, to which the LED PCB is thermally coupled, the top surface having an aperture through which extend the connector pins of the LED PCB connector, the heat sink being configured to thermally couple to the at least one LED;
(f) a vertical PCB configured to electrically couple the at least one connecting structure of the table portion to the connector pins of the LED PCB connector; and
(g) a globe having a bottom portion which is thermally coupled to an outer surface of the heat sink so as to permit heat to pass from the heat sink to the outside environment through the bottom portion of the globe, wherein the first and second wing portions each comprise a slot configured to accept the vertical PCB, side edges of the vertical PCB are seated in the respective slots of the first and second wing portions, and a bottom edge of the vertical PCB is structured to contact the at least one connecting structure of the table portion.

2. The LED lamp according to claim 1, wherein the at least one connecting structure of the table portion comprises clips in which the bottom edge of the vertical PCB is seated.

3. The LED lamp according to claim 1, wherein the lamp holder further comprises an upper rim configured to mate with a lower edge of the globe when the LED lamp is assembled.

4. The LED lamp according to claim 1, wherein at least one lower end of the first and second connection pins of the PCB assembly is spring loaded.

5. The LED lamp according to claim 1, wherein the heat sink is cylindrical in shape.

6. The LED lamp according to claim 1, wherein the heat sink is made of a material selected from a group consisting of aluminum, copper, alloys of aluminum and copper, steel, cast iron, plastic, and a combination thereof.

7. The LED lamp according to claim 1, wherein the lower portion is cylindrical.

8. A method of electrically coupling at least one LED of an LED lamp to a lamp base having a live contact and a neutral contact for supplying electrical power to the LED lamp, the method comprising:
(a) providing a lamp holder configured to seat within the lamp base, the lamp holder including first and second wing portions disposed along an interior surface of the lamp holder and extending outwardly from the lamp holder and away from the lamp base;
(b) providing a PCB assembly between the first and second wing portions, the PCB assembly comprising:
    (i) first and second connection pins, each having a lower end portion, the lower end portion of the first connection pin contacting the live contact of the lamp base and the lower end portion of the second connection pin contacting the neutral contact of the lamp base, the first and second connections pins are in parallel to each other,
    (ii) a table portion attached to the top of each of the first and second connection pins, and perpendicular to a lengthwise direction of the first and second connection pins, wherein the first and second wing portions are configured to accept the table portion such that the table portion is disposed between the first and second wing portions; and
(iii) at least one connecting structure formed at a top surface of the table portion and electrically coupled to the first and second connection pins;
(c) providing an LED PCB comprising at least one LED affixed to a PCB and an LED PCB connector having connector pins electrically coupled to the at least one LED and to the at least one connecting structure of the table portion;
(d) providing a vertical PCB configured to electrically couple the at least one connecting structure of the table portion to the connector pins of the LED PCB connector, wherein the first and second wing portions each comprise a slot configured to accept the vertical PCB, and wherein side edges of the vertical PCB are seated in the respective slots of the first and second wing portions, and a bottom edge of the vertical PCB is structured to contact the at least one connecting structure of the table portion; and
(e) actively electrically coupling the at least one LED to the lamp base by coupling the lower end portions of the first and second connection pins to the live and neutral contacts of the lamp base and by actively electrically coupling the at least one connecting structure to the first and second connection pins.

9. The method according to claim 8, wherein the at least one connecting structure of the table portion comprises clips into which the bottom edge of the vertical PCB is seated.

10. The method according to claim 8, wherein at least one lower end of the first and second connection pins of the PCB assembly is spring loaded.

11. A device for electrically coupling at least one LED of an LED lamp to a lamp base having a live contact and a neutral contact for supplying electrical power to the LED lamp, the device comprising:
a lamp holder seated within the lamp base, the lamp holder including first and second wing portions disposed along an interior surface of the lamp holder and extending outwardly from the lamp holder and away from the lamp base;
a PCB assembly disposed within the lamp holder, comprising:
(a) first and second connection pins, each having a lower end portion, the lower end portion of the first connection pin contacting the live contact of the lamp base and the lower end portion of the second connection pin contacting the neutral contact of the lamp base, the first and second connection pins are in parallel to each other,
(b) a table portion attached to a top of each of the first and second connection pins, and perpendicular to a lengthwise direction of the first and second connection pins, wherein the first and second wing portions are configured to accept the table portion such that the table portion is disposed between the first and second wing portions; and
(c) at least one connecting structure formed at a top surface of the table portion and electrically coupled to the first and second connection pins; and
a vertical PCB configured to electrically couple the at least one connecting structure of the table portion to the at least one LED, wherein the first and second wing portions each comprise a slot configured to accept the vertical PCB, side edges of the vertical PCB are seated in the respective slots of the first and second wing portions, and a bottom edge of the vertical PCB is structured to contact the at least one connecting structure of the table portion.

12. The device according to claim 11, further comprising:
an LED PCB comprising the at least one LED affixed to a PCB and an LED PCB connector having connector pins electrically coupled to the at least one LED of the LED PCB and to the at least one connecting structure of the table portion, the connector pins are in parallel to each other.

13. The device according to claim 11, wherein the at least one connecting structure of the table portion comprises clips into which the bottom edge of the vertical PCB is seated.

14. The device according to claim 11, wherein at least one lower end of the first and second connection pins of the PCB assembly is spring loaded.

15. An LED lamp having at least one LED, comprising:
a lamp base having a live contact and a neutral contact for supplying electrical power to the LED lamp;
a lamp holder comprising:
a lower portion seated within an upper portion of the lamp base, and
first and second wing portions disposed along an interior surface of the lamp holder and extending outwardly from the lamp holder in a first direction and away from the lamp base;
a first circuit board assembly comprising:
first and second connection pins extending substantially parallel to the first direction and configured to connect to the live contact and the neutral contact, respectively; and
a table portion comprising a connector on a first surface of the table portion, the connector being electrically coupled to the first and second connection pins connected to a second surface of the table portion and to the live and neutral contacts of the lamp base via the first and second connection pins, the first and second surfaces extending in respective planes that are substantially perpendicular to the first direction, wherein the first and second wing portions are configured to accept the table portion such that the table portion is disposed between the first and second wing portions; and
a second circuit board assembly configured to electrically couple the connector of the table portion to the at least one LED, wherein the first and second wing portions each comprise a slot configured to accept the second circuit board assembly, wherein opposite side edges of the second circuit board assembly are seated in the respective slots of the first and second wing portions, and a bottom edge of the second circuit board assembly is configured to contact the connector of the table portion.

* * * * *